United States Patent [19]

Yamachika et al.

[11] Patent Number: 5,731,125
[45] Date of Patent: Mar. 24, 1998

[54] CHEMICALLY AMPLIFIED, RADIATION-SENSITIVE RESIN COMPOSITION

[75] Inventors: Mikio Yamachika, Kuwana; Masatoshi Kusama, Tsurugashima; Yasutaka Kobayashi; Akira Tsuji, both of Yokkaichi, all of Japan

[73] Assignee: Japan Synthetic Rubber Co., Ltd., Tokyo, Japan

[21] Appl. No.: 597,561

[22] Filed: Feb. 2, 1996

[30] Foreign Application Priority Data

Feb. 13, 1995 [JP] Japan ............................ 7-046672

[51] Int. Cl.$^6$ .................................................. G03F 7/004
[52] U.S. Cl. ............................................................ 430/270.1
[58] Field of Search ................................. 430/270.1, 170, 430/171, 175, 176, 191, 196, 189

[56] References Cited

U.S. PATENT DOCUMENTS

| | | | |
|---|---|---|---|
| 5,164,278 | 11/1992 | Brunsvold et al. | 430/270.1 |
| 5,272,042 | 12/1993 | Allen et al. | 430/270.1 |
| 5,286,612 | 2/1994 | Telfer | 430/270.1 |
| 5,310,619 | 5/1994 | Crivello et al. | 430/270.1 |
| 5,322,765 | 6/1994 | Clecak et al. | 430/270.1 |
| 5,334,489 | 8/1994 | Grasshoff et al. | 430/270.1 |
| 5,338,818 | 8/1994 | Brunevold et al. | 430/270.1 |
| 5,374,500 | 12/1994 | Carpenter, Jr. et al. | 430/270.1 |
| 5,401,607 | 3/1995 | Takiff et al. | 430/270.1 |
| 5,558,971 | 9/1996 | Urano et al. | 430/270.1 |

FOREIGN PATENT DOCUMENTS 0 675 410   10/1995   European Pat. Off. .

OTHER PUBLICATIONS

Chemical Abstracts, vol. 122, No. 10, Mar. 6, 1995, AN–118690r.
Chemical Abstracts, vol. 118, No. 8, Feb. 22, 1993, AN–69897v.

*Primary Examiner*—Christopher G. Young
*Attorney, Agent, or Firm*—Oblon, Spivak, McClelland, Maier & Neustadt, P.C.

[57] ABSTRACT

A chemically amplified, radiation-sensitive resin composition which comprises a radiation-sensitive acid-generator which generates an acid upon irradiation with a radiation and in which the chemical change due to the catalytic action of said acid changes the solubility of the irradiated portion in a developer to form a pattern, characterized by comprising an anthracene derivative of the formula (1), representatives of which are anthracene-9-methanol and anthracene-9-carboxyethyl.

17 Claims, 1 Drawing Sheet

5,731,125

CHEMICALLY AMPLIFIED, RADIATION-SENSITIVE RESIN COMPOSITION

BACKGROUND OF THE INVENTION

This invention relates to a chemically amplified, radiation-sensitive resin composition, and more particularly, to a chemically amplified, radiation-sensitive resin composition suitable for micro engineering using a radiation such as ultraviolet ray, far ultraviolet ray, X ray or charged particle beam.

In the field of micro engineering, a representative of which is fabrication of integrated circuit, the size of pattern to be formed in lithography is increasingly becoming finer in order to obtain an integrated circuit of higher packing density. In recent years, a lithographic technique has been energetically developed which can stably conduct the micro engineering of 0.5 µm or less. This requires a resist capable of forming a pattern of 0.5 µm or less with high precision. For this purpose, a lithographic technique using a radiation having a shorter wavelength is under study.

As the above-mentioned shorter wavelength radiation, there are used, for example, ultraviolet rays, a representative of which is i line (wavelength: 365 nm); far ultraviolet rays, representatives of which are KrF excimer laser (wavelength: 248 nm), ArF excimer laser (wavelength: 193 nm); X rays, a representative of which is synchrotron radiation; charged particle beams, a representative of which is electron beam; and the like, and various resists adapted to these radiations have been proposed. In particular, attention has recently been paid to "chemically amplified resists".

In the case of this chemically amplified resist, a resist pattern is formed by generating an acid by irradiation with a radiation, causing a chemical change (for example, change of polarity, cleavage of chemical bond, cross-linking reaction or the like) by the catalytic action of this acid, and utilizing such a phenomenon that the solubility in a developer is changed in the irradiated portions.

Among such chemically amplified resists, as those which exhibit a relatively good resist performance, there have been proposed, for example, resists using an alkali-soluble resin whose alkali-philic group has been protected with a t-butyl or t-butoxycarbonyl group (see e.g. Japanese Patent Application Kokoku No. 2-27,660), resists using an alkali-soluble resin whose alkali-philic group has been protected with a silyl group (see e.g. Japanese Patent Application Kokoku No. 3-44,290), resists using a resin containing a (meth)acrylic acid moiety (see e.g. Japanese Patent Application Kokai No. 4-39,665) and the like.

These conventional chemically amplified resists can substantially reproduce a resist pattern on a silicon substrate; however, in the case of a substrate having a high reflectance, a representative of which is an aluminum substrate, the radiation with which the resist has been irradiated is reflected at the surface of the substrate and goes round to the unirradiated portions (this phenomenon is called "halation") to cause photochemical reaction there. In particular, this phenomenon is conspicuous in the step-structure portions. In the case of positive resists, the attenuation of pattern which is called "notching" or the like is caused in the step-structure portions, and in the case of negative resists, the thickening of pattern or the like is caused in the step-structure portions. Therefore, it is impossible to reproduce exactly the resist pattern, and as a result, such a problem rises that resolution, pattern shape, focus latitude and the like are deteriorated.

Referring to the accompanying drawings here, the halation phenomenon in the case of a positive resist is explained.

In FIG. 1, 1 refers to the coating film of a resist composition, 2 to the radiation applied, 3 to the radiation reflected at the surface of a substrate, 4 to the slant in a step-structure portion of a substrate and 5 to a substrate.

In this case, the radiation incident on the coating film 1 of a resist composition reflects at the slant 4 of the substrate 5 to go round to the right side in FIG. 1, and cause photochemical reaction in that portion of the coating film of a resist composition. As a result, it follows that excessive photochemical reaction is caused in the vicinity of the step-structure portion. Accordingly, as shown in FIG. 2, the attenuation 7 of pattern which is called "notching" is caused in the vicinity of the step-structure portion of the resist pattern 6.

The inventors of this invention have made extensive research to solve the above problems and have consequently found that they can be solved by incorporating a specific anthracene derivative into a conventional, chemically amplified, radiation-sensitive resin composition.

SUMMARY OF THE INVENTION

An object of this invention is to provide a novel, chemically amplified, radiation-sensitive resin composition.

Another object of this invention is to provide a chemically amplified, radiation-sensitive resin composition excellent in sensitivity, resolution, developability, pattern shape and the like.

A further object of this invention is to provide a chemically amplified, radiation-sensitive resin composition which not only can exactly reproduce a fine resist pattern even on a substrate having a particularly high reflectance but also is excellent in storage stability and can retain a good sensitivity and a good pattern shape even after a lapse of a long time from the preparation of the composition.

A still further object of this invention is to provide a chemically amplified, radiation-sensitive resin composition capable of effectively meeting various radiations such as ultraviolet rays, far ultraviolet rays, X rays and charged particle beams.

A still another object of this invention is to provide a chemically amplified, radiation-sensitive resin composition comprising a specific anthracene derivative.

Other objects and advantages of this invention will becomes apparent from the following description.

According to this invention, there is provided a chemically amplified, radiation-sensitive resin composition which comprises a radiation-sensitive acid-generator which generates an acid upon irradiation with a radiation and in which composition the chemical reaction caused by the catalytic action of the acid generated upon the irradiation changes the solubility of the irradiated portions in a developer to form a pattern, characterized by comprising at least one anthracene derivative represented by the formula (1):

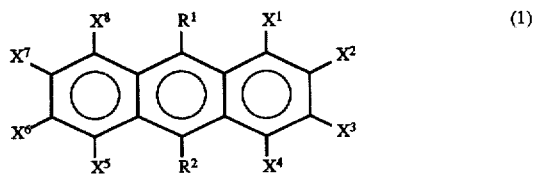

wherein $X^1$ to $X^8$ are the same as or different from one another and each represents a hydrogen atom, a halogen atom, an alkyl group, an alkoxy group, an aryl group or a nitro group; and $R^1$ and $R^2$ are the same as or different from each other and each represents a hydrogen atom, a halogen atom, an alkyl group, an alkoxy group, an aryl group, a nitro group, a —(CH$_2$)$_n$—O—R$^3$ group in which R$^3$ is a hydrogen atom, an alkyl group or an aryl group and n is an integer of 0 to 3, or a —(CH$_2$)$_n$COO—R$^4$ group in which R$^4$ is a hydrogen atom, an alkyl group or an aryl group and n is an integer of 0 to 3.

The chemically amplified, radiation-sensitive resin composition of this invention can be very suitably used as a chemically amplified resist for producing a semi-conductor device, the pattern of which is supposed to be made much finer in future.

BRIEF DESCRIPTION OF THE DRAWINGS

In FIGS. 1 and 2, 1 refers to the coating film of a resist composition, 2 to a radiation applied, 3 to a radiation reflected at the surface of a substrate, 4 to a slant, 5 to a substrate, 6 to a resist pattern and 7 to the attenuation of the pattern.

DETAILED DESCRIPTION OF THE INVENTION

Anthracene Derivative

Figure 1:
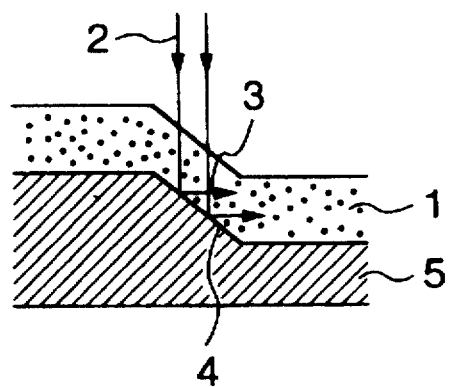
FIG. 1 is a longitudinal section of a positive resist for explaining a halation phenomenon in the resist.
Figure 2:
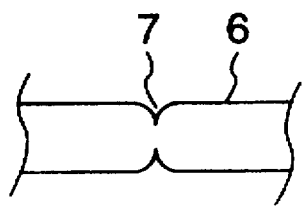
FIG. 2 is a plan view of a resist for showing the thinning of pattern.

The chemically amplified, radiation-sensitive resin composition of this invention is characterized by comprising at least one anthracene derivative represented by the above-mentioned formula (1). The anthracene derivative is explained below.

The anthracene derivative used in this invention is a compound which absorbs radiations having a wavelength falling within the wavelength region of the radiations to be applied to the resin composition, and when the anthracene derivative is incorporated into the chemically amplified, radiation-sensitive resin composition, it acts so as to lower the transmission of the radiation in the resist film and simultaneously to attenuate the radiation which reflects at the surface of a substrate and diffuses to resist film portions in which photochemical reaction is not desired to be caused by the radiation. As a result, the phenomenon that the reflected radiation goes round to resist film portions in which photochemical reaction is not desired to be caused by the radiation can be effectively inhibited and the stable halation-prevention can be achieved.

In the above formula (1), X$^1$ to X$^8$ may be the same as or different from one another, and each thereof represents a hydrogen atom, a halogen atom, an alkyl group, an alkoxy group, an aryl group or a nitro group. The halogen atom includes, for example, fluorine atom, chlorine atom, bromine atom and the like.

The alkyl group for X$^1$ to X$^8$ includes, for example, methyl group, ethyl group, n-propyl group, isopropyl group, n-butyl group, isobutyl group, sec-butyl group, t-butyl group, n-pentyl group, n-hexyl group, n-octyl group, n-dodecyl group and the like.

The alkoxy group for X$^1$ to X$^8$ includes, for example, methoxy group, ethoxy group, propoxy group, butoxy group and the like.

The aryl group for X$^1$ to X$^8$ includes, for example, phenyl group, o-methylphenyl group, m-methylphenyl group, p-methylphenyl group, o-chlorophenyl group, m-chlorophenyl group, p-chlorophenyl group, naphthyl group and the like.

In the above formula (1), R$^1$ and R$^2$ may be the same as or different from each other and each represents a hydrogen atom, a halogen atom, an alkyl group, an alkoxy group, an aryl group, a nitro group, a —(CH$_2$)$_n$—O—R$^3$ group in which R$^3$ represents a hydrogen atom, an alkyl group or an aryl group and n is an integer of 0 to 3, or a —(CH$_2$)$_n$—COO—R$^4$ group in which R$^4$ represents a hydrogen atom, an alkyl group or an aryl group and n is an integer of 0 to 3. The halogen atom, the alkyl group, the alkoxy group and the aryl group include, for example, those corresponding to the atoms and groups mentioned as to X$^1$ to X$^8$. The alkyl group and the aryl group for R$^3$ and R$^4$ include, for example, those corresponding to the groups mentioned as to X$^1$ to X$^8$.

The anthracene derivatives represented by the formula (1) used in this invention are preferably compounds represented by the following formulas (2) and (3):

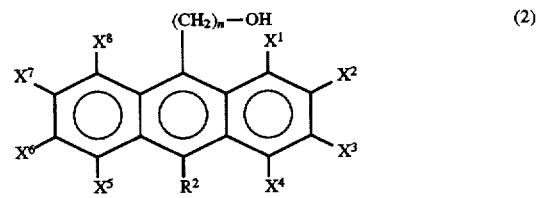

(2)

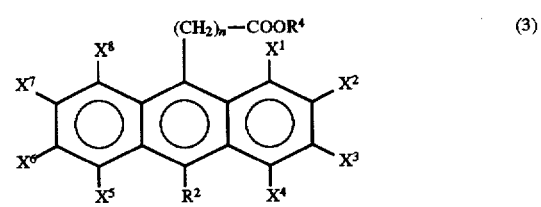

(3)

Among the anthracene derivatives represented by the formulas (2) and (3), particularly preferable are those in which all X$^1$ to X$^8$ are hydrogen atoms. More preferable anthracene derivatives are anthracene-9-methanol, anthracene-9-carboxyethyl, anthracene-9-carboxy-n-butyl and the like.

The above anthracene derivatives may be used alone or in admixture of two or more.

Chemically Amplified, Radiation-sensitive Resin Composition

The chemically amplified, radiation-sensitive resin composition of this invention comprises a radiation-sensitive acid-generator (referred to hereinafter as merely the acid-generator) which generates an acid upon irradiation with a radiation (referred to hereinafter as the exposure) and the catalytic action of the acid generated causes a chemical reaction, whereby the solubility of the exposed portions of the resist in a developer is changed to thereby form a pattern. Representatives of such a chemically amplified, radiation-sensitive resin composition are the following resist compositions (A) to (C):

(A) Positive type chemically amplified, radiation-sensitive resin compositions [referred to hereinafter as the resist composition (A)] comprising:

(a) a resin which consists of an alkali-insoluble or -sparingly soluble resin protected with an acid-decomposable group and which becomes alkali-soluble when the acid-decomposable group is decomposed in the presence of an acid (said resin is referred to hereinafter as the acid-decomposable group-containing resin), (b) an acid-generator and (c) an anthracene derivative represented by the above formula (1).

(B) Positive type chemically amplified, radiation-sensitive resin compositions [referred to hereinafter as the resist composition (B)] comprising:

(d) an alkali-soluble resin, (b) an acid-generator, (e) a compound (referred to hereinafter as the dissolution-controlling agent) which has the properties of controlling the alkali-solubility of the alkali-soluble resin (d), said properties being reduced or lost when the compound is decomposed in the presence of an acid, or which has the action of increasing the alkali-solubility of the alkali-soluble resin, and (c) an anthracene derivative represented by the above formula (1).

(C) Negative type chemically amplified, radiation-sensitive resin composition [referred to hereinafter as the resist composition (C)] comprising:

(d) an alkali-soluble resin, (b) an acid-generator, (f) a compound which cross-links the alkali-soluble resin (d) in the presence of an acid (referred to hereinafter as the cross-linking agent), and (c) an anthracene derivative represented by the above formula (1).

The constituents other than the anthracene derivative of the formula (1) of the above resist compositions (A) to (C) are successively explained in detail below.

Acid-decomposable Group-containing Resin

The acid-decomposable group-containing resin used in the resist composition (A) is a resin which is per se alkali-insoluble or alkali-sparingly soluble and which is prepared by protecting the acidic functional group such as phenolic hydroxyl group, carboxyl group or the like of an alkali-soluble resin, for example, as mentioned hereinafter with at least one substituent which can decompose in the presence of an acid to make the protected resin alkali-soluble (the substituent is referred to hereinafter as the acid-decomposable group). The term "alkali-insoluble or alkali-sparingly soluble" used herein means the properties that when under the alkali-developing conditions adopted in the formation of a resist pattern from a resist film formed using the resist composition (A), a film formed using only the acid-decomposable group-containing resin is subjected to development treatment in place of the above resist film, the film remains in a proportion of 50% or more of the initial film thickness after the development treatment.

Said acid-decomposable group includes, for example, substituted methyl groups, 1-substituted ethyl groups, 1-branched alkyl groups, silyl groups, germyl groups, alkoxycarbonyl groups, acyl groups, cyclic acid-decomposable groups and the like.

The above substituted methyl groups include, for example, methoxymethyl group, methylthiomethyl group, ethoxymethyl group, ethylthiomethyl group, methoxyethoxymethyl group, t-butoxycarbonylmethyl group, benzyloxymethyl group, benzylthiomethyl group, phenacyl group, bromophenacyl group, methoxyphenacyl group, methylthiophenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group and the like.

The above 1-substituted ethyl groups include, for example, 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropyethyl group, 1-phenylethyl group, 1,1-diphenylethyl group, α-methylphenacyl group and the like.

The above 1-branched alkyl groups include, for example, isopropyl group, sec-butyl group, t-butyl group, 1,1-dimethylpropyl group, 1-methylbutyl group, 1,1-dimethylbutyl group and the like.

The above silyl groups include, for example, trimethylsilyl group, ethyldimethylsilyl group, methyldiethylsilyl group, triethylsilyl group, isopropyldimethylsilyl group, methyldiisopropylsilyl group, triisopropylsilyl group, t-butyldimethylsilyl group, methyldi-t-butylsilyl group, tri-t-butylsilyl group, phenyldimethylsilyl group, methyldiphenylsilyl group, triphenylsilyl group and the like.

The above germyl groups include, for example, trimethylgermyl group, ethyldimethylgermyl group, methyldiethylgermyl group, triethylgermyl group, isopropyldimethylgermyl group, methyldiisopropylgermyl group, triisopropylgermyl group, t-butyldimethylgermyl group, methyldi-t-butylgermyl group, tri-t-butylgermyl group, phenyldimethylgermyl group, methyldiphenylgermyl group, triphenylgermyl group and the like.

The above alkoxycarbonyl groups include, for example, methoxycarbonyl group, ethoxycarbonyl group, isopropoxycarbonyl group, t-butoxycarbonyl group, t-pentyloxycarbonyl group and the like.

The above acyl groups include, for example, acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, camphoroyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group and the like.

The above cyclic acid decomposable groups include, for example, cyclopropyl group, cyclopentyl group, cyclohexyl group, cyclohexenyl group, oxocyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, 2-1,3-dioxolanyl group, 2-1,3-dithioxolanyl group, benzo-2-1,3-dioxolanyl group, benzo-2-1,3-dithioxolanyl group and the like.

Among these acid-decomposable groups, preferable are t-butyl group-containing substituents such as t-butyl group, t-butoxycarbonylmethyl group, t-butoxycarbonyl group and the like; 1-substituted ethyl groups such as 1-methoxyethyl group, 1-ethoxyethyl group and the like; etc.

The proportion of the acid-decomposable group introduced into the acid-decomposable group-containing resin (the ratio of the number of the acid-decomposable groups to the total number of the acidic functional groups and the acid-decomposable groups in the acid-decomposable group-containing resin) is preferably 15 to 100%, more preferably 15 to 80% and most preferably 15 to 60%.

The polystyrene-reduced weight average molecular weight (referred to hereinafter as Mw) of the acid-decomposable group-containing resin as measured by a gel permeation chromatography is preferably 1,000 to 150,000, more preferably 3,000 to 100,000.

The acid-decomposable group-containing resin can be produced by, for example, substituting at least one acid-decomposable group for the hydrogen atoms of at least one acidic functional group in the alkali-soluble resin, or by (co)polymerizing at least one monomer having at least one acid-decomposable group or can also be produced by (co)polycondensation of at least one polycondensing component having at least one acid-decomposable group.

In the resist composition (A), the acid-decomposable group-containing resin can be used alone or in admixture of two or more. When a mixture of at least two acid-decomposable group-containing resins is used, a combination of a resin having a t-butyl group-containing substituent as the acid-decomposable group with a resin having a 1-substituted ethyl group as the acid-decomposable group is preferred.

The acid-decomposable group-containing resin used in the resist composition (A) is a resin which has the properties of controlling the alkali-solubility of the alkali-soluble resin, the said properties being reduced or lost when the resin is decomposed in the presence of an acid, or which has the action of increasing the alkali-solubility of the alkali-soluble resin, and hence, the resin falls within the category of the dissolution-controlling agent in the resist composition (B).

Alkali-soluble Resin

The alkali-soluble resin used in the resist composition (B) and the resist composition (C) may be any resin which has at least one acidic functional group exhibiting an affinity for the alkali developer, for example, phenolic hydroxyl group, carboxyl group or the like and is soluble in the alkali developer and is not critical.

Said alkali-soluble resin includes, for example, a vinylic resin having a repeating unit resulting from cleavage of the polymerizable double bond of at least one monomer having an acidic functional group such as hydroxystyrene, hydroxy-α-methylstyrene, vinylbenzoic acid, carboxymethylstyrene, carboxymethoxystyrene, (meth)acrylic acid, crotonic acid, maleic acid, fumaric acid, itaconic acid, citraconic acid, mesaconic acid, cinnamic acid or the like; a condensation type resin having a condensation type repeating unit having an acidic functional group, a representative of which is a novolak resin; and the like.

When the alkali-soluble resin is the above-mentioned vinylic resin, the resin may be composed only of the repeating unit resulting from cleavage of the polymerizable double bond of the above-mentioned acidic functional group-containing monomer; however, the resin may further comprise at least one other repeating unit as far as the resulting resin is soluble in an alkali developer.

Such a repeating unit includes, for example, repeating units resulting from cleavage of the polymerizable double bond of a polymerizable double bond-containing monomer such as styrene, α-methylstyrene, vinyltoluene, maleic anhydride, (meth)acrylonitrile, crotonitrile, maleinitrile, fumaronitrile, mesaconitrile, citraconitrile, itaconitrile, (meth)acrylamide, crotonamide, maleinamide, fumaramide, mesaconamide, citraconamide, itaconamide, vinylaniline, vinylpyridine, vinyl-ε-caprolactam, vinylpyrrolidone, vinylimidazole and the like.

The alkali-soluble resin composed of the above-mentioned vinylic resin can be produced, for example, by (co)polymerizing at least one monomer having an acidic functional group, if necessary, together with at least one other monomer, or produced by (co)polymerizing at least one monomer having a protected acidic functional group, if necessary, together with at least one other monomer and then converting the protected group of the resulting (co)polymer to the original acidic functional group.

These (co)polymerizations can be conducted by a suitable polymerization method such as a bulk polymerization method, a solution polymerization method, a precipitation polymerization method, an emulsion polymerization method, a suspension polymerization method, a bulk-suspension polymerization method or the like using a polymerization initiator or catalyst appropriately selected depending upon the kinds of the monomer and the reaction medium such as a radical polymerization initiator, an anionic polymerization catalyst, a coordination anionic polymerization catalyst, a cationic polymerization catalyst or the like.

When the alkali-soluble resin is the above-mentioned condensation type resin, this resin may be composed only of a condensation type repeating unit having an acidic functional group; however, it may further comprise another repeating unit as far as the resulting resin is soluble in an alkali developer.

Said condensation type resin can be produced, for example, by (co)polycondensing at least one phenol and at least one aldehyde together with, if necessary, other polycondensing components capable of forming a condensation type repeating unit in the presence of an acidic catalyst in water medium or a mixed medium of water and a hydrophilic solvent.

The above-mentioned phenol includes, for example, o-cresol, m-cresol, p-cresol, 2,3-xylenol, 2,4-xylenol, 2,5-xylenol, 3,4-xylenol, 3,5-xylenol, 2,3,5-trimethylphenol, 3,4,5-trimethylphenol and the like. The above-mentioned aldehyde includes, for example, formaldehyde, trioxane, paraformaldehyde, benzaldehyde, acetaldehyde, propylaldehyde, phenylacetaldehyde, glyoxal, glutaraldehyde, terephthalaldehyde, isophthalaldehyde and the like.

The content of the repeating unit having an acidic functional group in the alkali-soluble resin cannot be uniquely determined because it may be varied depending upon the kind of the other repeating units optionally contained; however, the content is preferably 15 to 100 mole %, more preferably 20 to 100 mole %.

The Mw of the alkali-soluble resin may be varied depending upon the desired characteristics of the resist composition (B) or the resist composition (C); however, it is preferably 1,000 to 150,000, more preferably 3,000 to 100,000.

When the alkali-soluble resin has a repeating unit containing a carbon—carbon unsaturation, it may be used in the form of a hydrogenation product. In this case, the hydrogenation degree is preferably 70% or less, more preferably 50% or less and most preferably 40% or less, of the carbon—carbon unsaturation contained in the repeating unit. When the hydrogenation degree is more than 70%, the solubility of the alkali-soluble resin in an alkali developer tends to be lowered.

In the resist composition (B) and the resist composition (C), the alkali-soluble resins may be used alone or in admixture of two or more.

Acid-generator

The acid-generator used in each of the resin composition (A), the resist composition (B) and the resist composition (C) includes, for example, (i) onium salt compounds, (ii) halogen-containing compounds, (iii) sulfone compounds, (iv) sulfonic acid ester compounds, (v) quinonediazide compounds, etc.

Specific examples of these acid-generators include those mentioned below.

(i) Onium salt compounds

The onium salt compounds include, for example, iodonium salts, sulfonium salts, phosphonium salts, diazonium salts, pyridinium salts and the like.

Preferable onium salt compounds include diphenyliodonium trifluoromethanesulfonate, diphenyliodonium pyrenesulfonate, diphenyliodonium dodecylbenzenesulfonate, triphenylsulfonium triflate, triphenylsulfonium hexafluoroantimonate, triphenylsulfonium naphthalenesulfonate, (hydroxyphenyl)benzylmethylsulfonium toluenesulfonate and the like.

(ii) Halogen-containing compounds

The halogen-containing compounds include haloalkyl group-containing hydrocarbon compounds, haloalkyl group-containing heterocyclic compounds and the like.

Preferable halogen-containing compounds include (trichloromethyl)-s-triazine derivatives such as phenyl-bis(trichloromethyl)-s-triazine, methoxyphenyl-bis(trichloromethyl)-s-triazine, naphthyl-bis(trichloromethyl)-s-triazine and the like; 1,1-bis(4-chlorophenyl)-2,2,2-trichloroethane; and the like.

(iii) Sulfone compounds

The sulfone compounds include, for example, β-ketosulfone, β-sulfonylsulfone, α-diazo compounds thereof and the like.

Preferable sulfone compounds include phenacylphenylsulfone, mesytilphenacylsulfone, bis(phenylsulfonyl)methane, bis(phenylsulfonyl)diazomethane, bis(cyclohexylsulfonyl)diazomethane, 4-trisphenacylsulfone and the like.

(iv) Sulfonic acid ester compounds

The sulfonic acid ester compounds include, for example, alkylsulfonic acid esters, haloalkylsulfonic acid esters, arylsulfonic acid esters, iminosulfonates, imidosulfonates and the like.

Preferable sulfonic acid ester compounds include benzoin rosylate, tristriflate of pyropallol, nitrobenzyl-9,10-diethoxyanthracene-2-sulfonate, N-(trifluoromethylsulfonyloxy)maleimide, N-(trifluoromethylsulfonyloxy)phthalimide, N-(trifluoromethylsulfonyloxy)-bicyclo[2.2.1]hept-5-ene-2,3-dicarboxyimide, N-(trifluoromethylsulfonyloxy)naphthylimide, N-(camphanylsulfonyloxy)naphthylimide and the like.

(v) Quinonediazide compounds

The quinonediazide compounds include, for example, 1,2-quinonediazidosulfonic acid ester compounds, diazobenzoquinone compounds, diazonaphthoquinone compounds and the like of polyhydroxyl compounds.

Examples of the quinonediazide compounds include compounds having a 1,2-quinonediazidosulfonyl group such as 1,2-benzoquinonediazido-4-sulfonyl group, 1,2-naphthoquinonediazido-4-sulfonyl group, 1,2-naphthoquinonediazido-5-sulfonyl group, 1,2-naphthoqhinonediazido-6-sulfonyl group or the like, and particularly preferable are compounds having a 1,2-naphthoquinonediazido-4-sulfonyl group and/or a 1,2-naphthoquinonediazido-5-sulfonyl group.

Specific examples of such quinonediazide compounds include 1,2-quinonediazidosulfonic acid esters of (poly)hydroxyphenyl aryl ketones such as 2,3,4-trihydroxybenzophenone, 2,3,4,4'-tetrahydroxybenzophenone and the like; 1,2-quinonediazidosulfonic acid esters of bis[(poly)hydroxyphenyl]alkanes such as bis(4-hydroxyphenyl)methane, bis(2,4-dihydroxyphenyl)methane, 2,2-bis(4-hydroxyphenyl)propane and the like; 1,2-quinonediazidosulfonic acid esters of (poly)hydroxytriphenylalkanes such as 4,4',4"-trihydroxytriphenylmethane, 1,1,1-tris(4-hydroxyphenyl)ethane, 1,1-bis(4-hydroxyphenyl)-1-[4-{1-(4-hydroxyphenyl)-1-methylethyl}phenyl]ethane and the like; 1,2-quinonediazidosulfonic acid esters of (poly)hydroxyphenylflavans such as 2,4,4-trimethyl-2',4',7-trihydroxy-2-phenylflavan, 2,4,4-trimethyl-2',4',5',6,7-pentahydroxy-2-phenylflavan and the like; etc.

Among these quinonediazide compounds, preferable are 1,2-naphthoquinonediazido-4-sulfonic acid ester of 1,1-bis(4-hydroxyphenyl)-1-[4-{1-hydroxyphenyl)-1-methylethyl}phenyl]ethane and the like.

In the resist composition (A), the resist composition (B) and the resist composition (C), the acid-generators can be used alone or in admixture of two or more.

Dissolution-controlling Agent

The dissolution-controlling agent used in the resist composition (B) is a compound which has the properties of controlling the alkali-solubility of the above-mentioned alkali-soluble resin, said properties being reduced or lost when the compound is decomposed, for example, hydrolyzed in the presence of an acid, or which has the action of increasing the alkali-solubility of the alkali-soluble resin.

Said dissolution-controlling agent includes, for example, compounds having at least one substituent which can be decomposed into an acidic functional group such as phenolic hydroxyl group, carboxyl group or the like in the presence of an acid (the substituent is referred to hereinafter as the acid-decomposable substituent).

The acid-decomposable substituent includes, for example, the same groups as the substituted methyl groups, 1-substituted ethyl groups, 1-branched alkyl groups, silyl groups, germyl groups, alkoxycarbonyl groups, acyl groups, cyclic acid-decomposable groups and the like mentioned above as examples of the acid-decomposable group as to the above acid-decomposable group-containing resins.

The dissolution-controlling agent may be of a low molecular weight or a high molecular weight, and preferable dissolution-controlling agents are compounds formed by introducing the above acid-decomposable substituent into a polyhydric phenolic compound such as bisphenol A, bisphenol F, bisphenol S or the like; and compounds formed by introducing the above acid-decomposable substituent into a carboxylic acid compound such as hydroxyphenylacetic acid or the like.

Preferable specific examples of the low molecular weight dissolution-controlling agent are compounds represented by the following formulas (4) and (5):

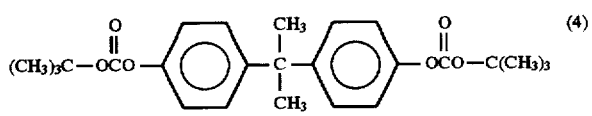

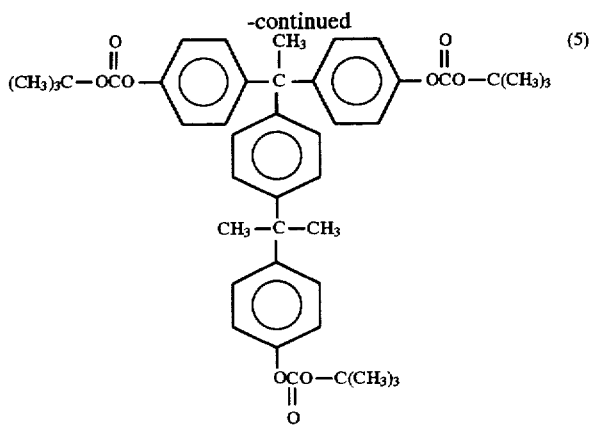

As the high molecular weight dissolution-controlling agent, there can be used, for example, the above-mentioned acid-decomposable group-containing resins.

In the resist composition (B), as the dissolution-controlling agent, the low molecular weight compounds and the high molecular weight compounds can be used respectively alone or in admixture of two or more, or a combination of the low molecular weight compound and the high molecular weight compound can also be used.

Cross-linking Agent

The cross-linking agent used in the resist composition (C) is, for example, a compound which cross-links the alkali-soluble resin in the presence of the acid generated upon the exposure.

Said cross-linking agent includes, for example, compounds having at least one substituent having a cross-linking reactivity with the above-mentioned alkali-soluble resin (the substituent is referred to hereinafter as the cross-linking substituent).

The cross-linking substituent includes, for example, groups represented by the following formulas.

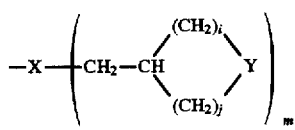

wherein m is 1 or 2; X is, when m=1, a single linkage, —O—, —S—, —COO— or —NH— and when m=2, a trivalent nitrogen atom; Y is —O— or —S—; i is an integer of 0 to 3; j is an integer of 1 to 3; and i+j=1 to 4.

$$-(-C(R^5)(R^6)-)_k-Z-R^7$$

wherein k is an integer of 1 or more; $R^5$ and $R^6$ are the same as or different from each other and each represents a hydrogen atom or an alkyl group having 1 to 4 carbon atoms; Z is —O—, —COO— or —CO—; $R^7$ represents an alkyl group having 1 to 5 carbon atoms, an aryl group having 6 to 12 carbon atoms or an aralkyl group having 7 to 14 carbon atoms.

$$-C(R^8)=C(R^9)(R^{10})$$

wherein $R^8$, $R^9$ and $R^{10}$ are the same as or different from one another and each represents a hydrogen atom or an alkyl group having 1 to 4 carbon atoms.

$$-(-C(R^{11})(R^{12})-)_k-N(R^{13})(R^{14})$$

wherein k is an integer of 1 or more; $R^{11}$ and $R^{12}$ are the same as or different from each other and each represents a hydrogen atom or an alkyl group having 1 to 4 carbon atoms; $R^{13}$ and $R^{14}$ are the same as or different from each other and each represents an alkylol group having 1 to 5 carbon atoms.

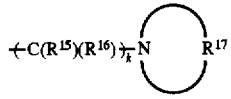

wherein k is an integer of 1 or more; $R^{15}$ is and $R^{16}$ are the same as or different from each other and each represents a hydrogen atom or an alkyl group having 1 to 4 carbon atoms; $R^{17}$ represents a divalent organic group forming a 3–8 membered ring and containing a hetero atom selected from the group consisting of oxygen atom, sulfur atom and nitrogen atom.

Specific examples of the above cross-linking substituent include glycidyl ether group, glycidyl ester group, glycidylamino group, methoxymethyl group, ethoxymethyl group, benzyloxymethyl group, dimethylaminomethyl group, diethylaminomethyl group, dimethylolaminomethyl group, diethylolaminomethyl group, bis(methoxymethyl)amino group, morpholinomethyl group, acetoxymethyl group, benzoyloxymethyl group, formyl group, acetyl group, vinyl group, isopropenyl group and the like.

The compounds having the above-mentioned substituent include, for example, bisphenol A type epoxy compounds, bisphenol F type epoxy compounds, bisphenol S type epoxy compounds, novolak resin type epoxy compounds, resol resin type epoxy compounds, poly(hydroxystyrene) type epoxy compounds, methylol group-containing melamine compounds, methylol group-containing benzoguanamine compounds, methylol group-containing urea compounds, methylol group-containing glycoluril compounds, methylol group-containing phenol compounds, alkoxyalkyl group-containing melamine compounds, alkoxyalkyl group-containing benzoguanamine compounds, alkoxyalkyl group-containing urea compounds, alkoxyalkyl group-containing glycoluril compounds, alkoxyalkyl group-containing phenol compounds, carboxymethyl group-containing melamine compounds, carboxymethyl group-containing benzoguanamine compounds, carboxymethyl group-containing urea compounds, carboxymethyl group-containing glycoluril compounds, carboxymethyl group-containing phenol compounds and the like.

Among the compounds having the above-mentioned cross-linking substituent, preferable are methylol group-containing phenol compounds, methoxymethyl group-containing melamine compounds, methoxymethyl group-containing urea compounds, methoxymethyl group-containing glycoluril compounds, methoxymethyl group-containing phenol compounds, acetoxymethyl group-containing phenol compounds and the like.

Among the compounds having the above cross-linking substituent, commercially available methoxymethyl group-containing melamine compounds are CYMEL300, CYMEL301, CYMEL303, CYMEL305 (trade names of Mitusi Cyanamid) and the like; commercially available methoxymethyl group-containing glycoluril compounds are CYMEL1174 (a trade name of Mitsui Cyanamid) and the like; and commercial available methoxymethyl group-containing urea compounds are MX-290 (a trade name of Sanwa Chemical) and the like. Specifically, the compounds represented by the following formulas (6), (7) and (8) can be mentioned:

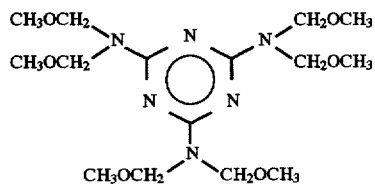
(6)

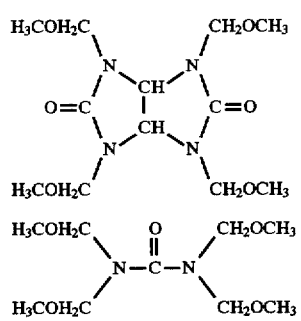
(7)

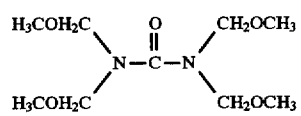
(8)

Moreover, as the cross-linking agent, there can be suitably used a resin derived from the above-mentioned alkali-soluble resin to which the properties as a cross-linking agent have been imparted by introducing the above-mentioned cross-linking substituent into the acidic functional group of the alkali-soluble resin. In this case, the proportion of the cross-linking substituent introduced is preferably 5 to 60 mole %, more preferably 10 to 50 mole % and most preferably 15 to 40 mole %, based on the total mole of the acidic functional groups in the alkali-soluble resin. When the proportion is less than 5 mole %, it becomes difficult to sufficiently cause the cross-linking reaction and there is a tendency that the yield of residual film thickness is reduced, a curved resist pattern is formed and swelling is caused. When the proportion is more than 60 mole %, the alkali-solubility of the alkali-soluble resin tends to be deteriorated and the developability tends to be deteriorated.

In the resist composition (C), the cross-linking agents can be used alone or in admixture of two or more.

Additive

The resist composition (A), the resist composition (B) and the resist composition (C) may, if necessary, have added thereto various additives such as acid-diffusion-controlling agent, surfactant, sensitizing agent and the like.

The above acid-diffusion-controlling agent is a component to be added to the resin composition for the purpose of controlling the diffusion in the resist film of the acid generated from the acid-generator upon the exposure and controlling the undesired chemical reaction in the unexposed area. By use of such an acid-diffusion-controlling agent, the shape of pattern formed can be improved, the formation of visor particularly in the upper layer can be inhibited and the dimension fidelity to the mask dimension can be improved.

As the acid-diffusion-controlling agent, there can be suitably used, for example, nitrogen compounds which can keep its basicity after the exposure or even after heating.

Specific examples of such nitrogen compounds include ammonia, trimethylamine, triethylamine, tripropylamine, tributylamine, tripentylamine, trihexylamine, triheptylamine, trioctylamine, aniline, N-methylaniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrrolidone, piperidine, imidazole, 4-methylimidazole, 4-methyl-2-phenylimidazole, benzimidazole, thiabendazole, pyridine, 2-methylpyridine, 4-ethylpyridine, 2-phenylpyridine, 4-phenylpyridine, 1-methyl-4-phenylpyridine, 2-(1-ethylpropyl)pyridine, 2-benzylpyridine, nicotinamide, dibenzoylthiamine, tetrabutyric acid libofuravine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene and the like.

Among these acid-diffusion-controlling agents, particularly preferable are tributylamine, tripentylamine, trihexylamine, triheptylamine, trioctylamine, benzimidazole, 4-phenylpyridine, 4,4'-diaminodiphenyl ether, nicotinamide and the like.

The above acid-diffusion-controlling agents can be used alone or in admixture of two or more.

The amount of the acid-diffusion-controlling agent added may be varied depending upon the kind thereof, combination with the acid-generator and the like; however, the amount is preferably 10 parts by weight or less, more preferably 5 parts by weight or less, per 100 parts by weight of the total resin components in the resin composition. When the amount of the acid-diffusion-controlling agent exceeds 10 parts by weight, the sensitivity and the developability of the exposed portion tend to be lowered.

The above-mentioned surfactant exhibits the action of improving the coatability and striation of each resist composition and the developability as a resist, and the like.

As the above surfactants, there can be mentioned, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol disearate and commercial products having the following trade names: KP341 (a trade name of Shin-Etsu Chemical Co., Ltd.), Polyflow No. 75 and No. 95 (trade names of Kyoeisha Yushikagaku Kogyo K. K.), F Top EF301, EF303 and EF352 (trade names of Tohchem Products), Megafac F171, F172 and F173 (trade names of DAINIPPON INK & CHEMICALS, INC.), Fluorad FC430 and FC431 (trade names of Sumitomo 3M Limited), Asahi Guard AG710 and Surflon S382, SC-101, SC-102, SC-103, SC-104, SC-105 and SC-106 (trade names of Asahi Glass Co., Ltd.) and the like.

These surfactants can be used alone or in admixture of two or more.

The amount of the surfactant added is preferably 2 parts by weight or less per 100 parts by weight of the total resin components of each resist composition.

The above-mentioned sensitizing agent is a compound which exhibits the action of absorbing the energy of a radiation and transferring the energy to the acid-generator to thereby increase the amount of the acid produced, and has the effect of enhancing the apparent sensitivity of the resist formed from each resist composition.

Preferable sensitizing agents are ketones, benzenes, acetophenones, benzophenones, naphthalenes, biacetyl, eosine, rose bengal, pyrenes, phenothiazines and the like.

These sensitizing agents can be used alone or in admixture of two or more.

The amount of the sensitizing agent added is preferably 50 parts by weight or less, more preferably 30 parts by weight or less, per 100 parts by weight of the total resin components of each resist composition.

By incorporating a dye or pigment, it is possible to visualize the latent image in the exposed portion and mitigate the influence of halation at the time of the exposure. Moreover, by incorporating an adhesive adjuvant, the adhesiveness to a substrate can be improved.

In addition, as other additives, there can be mentioned halation-preventing agents such as azo compounds, amine compounds and the like; shape-improving agents; storage-stabilizing agents, defoaming agents and the like.

Formulation of Chemically Amplified, Radiation-sensitive Resin Composition

The formulation of each of the resist composition (A), the resist composition (B) and the resist composition (C) is illustrated below.

In the resist composition (A), per 100 parts by weight of the acid-decomposable group-containing resin, the amount of the acid-generator is preferably 0.05 to 20 parts by weight, more preferably 0.1 to 15 parts by weight and most preferably 0.2 to 10 parts by weight; the amount of the anthracene derivative represented by the formula (1) is preferably 0.05 to 20 parts by weight, more preferably 0.1 to 10 parts by weight and most preferably 0.2 to 5 parts by weight.

In the resist composition (A), when the amount of the acid-generator is less than 0.05 part by weight, there is a fear that it may become difficult to effectively cause the chemical change by the catalytic action of the acid generated upon the exposure. On the other hand, when the amount of the acid-generator exceeds 20 parts by weight, there is a fear that unevenness of coating may be caused when the resist composition (A) is applied to a substrate and scum or the like may be generated at the time of development. Also, when the amount of the anthracene derivative of the formula (1) is less than 0.05 part by weight, it is impossible for the anthracene derivative to absorb sufficiently the radiation reflected at the surface of the substrate and there is a fear that it may become difficult for the anthracene derivative to sufficiently exhibit its halation-preventing effect which is the main effect of this invention. On the other hand, when the amount of the anthracene derivative added exceeds 20 parts by weight, the ability of the resist composition (A) to absorb a radiation becomes too large, and hence, the amount of the radiation reaching the vicinity of the substrate is diminished. As a result, the resolution and the like tend to be deteriorated. Incidentally, it is possible to add the above-mentioned low molecular weight dissolution-controlling agent to the resist composition (A) in a proportion of preferably 50 parts by weight or less per 100 parts by weight of the acid-decomposable group-containing resin.

In the resist composition (B), per 100 parts by weight of the alkali-soluble resin, the amount of the acid-generator contained is preferably 0.05 to 20 parts by weight, more preferably 0.1 to 15 parts by weight and most preferably 0.5 to 10 parts by weight; the amount of the dissolution-controlling agent contained is preferably 5 to 150 parts by weight, more preferably 5 to 100 parts by weight and most preferably 5 to 50 parts by weight; and furthermore, the amount of the anthracene derivative of the formula (1) contained is 0.05 to 20 parts by weight, more preferably 0.1 to 10 parts by weight and most preferably 0.2 to 5 parts by weight.

In the resist composition (B), when the amount of the acid-generator contained is less than 0.05 part by weight, there is a fear that it may become difficult to effectively cause the chemical change by the catalytic action of the acid generated upon the exposure, while when the amount exceeds 20 parts by weight, there is a fear that the unevenness of coating may be caused and scum or the like may be generated at the time of development. Also, when the amount of the dissolution-controlling agent added is less than 5 parts by weight, there is a fear that the desired effect based on the dissolution-controlling agent may not be sufficiently exhibited, while when the amount exceeds 150 parts by weight, the film-formability of the resist composition (B) and the film strength or the like tend to be deteriorated. Moreover, the amount of the anthracene derivative of the formula (1) contained is less than 0.05 part by weight, it is impossible for the anthracene derivative to sufficiently absorb the radiation reflected at the surface of the substrate and hence there is a fear that the halation-preventing effect which is the main effect of this invention may not be sufficiently exhibited. On the other hand, when the amount exceeds 20 parts by weight, the ability of the resist composition (B) to absorb the radiation becomes too large, and hence, the amount of the radiation reaching the vicinity of the substrate is reduced, and as a result, the resolution or the like tends to be deteriorated.

In the resist composition (C), per 100 parts by weight of the alkali-soluble resin, the amount of the acid-generator contained is preferably 0.05 to 20 parts by weight, more preferably 0.1 to 15 parts by weight and most preferably 0.5 to 10 parts by weight; the amount of the cross-linking agent contained is preferably 3 to 85 parts by weight, more preferably 5 to 75 parts by weight and most preferably 10 to 65 parts by weight; and the anthracene derivative of the formula (1) is preferably 0.05 to 20 parts by weight, more preferably 0.1 to 10 parts by weight and most preferably 0.2 to 5 parts by weight.

In the resist composition (C), when the amount of the acid-generator contained is less than 0.05 part by weight, there is a fear that it may become difficult to effectively cause the chemical change by the catalytic action of the acid generated upon the exposure. On the other hand, when the amount of the acid-generator contained exceeds 20 parts by weight, there is a fear that unevenness of coating may be caused in applying the resist composition (C) and scum or the like may be generated at the time of development. Also, when the amount of the cross-linking agent contained is less than 3 parts by weight, in general, the cross-linking tends to become insufficient, and there is a fear that the yield of residual film thickness may be lowered, curved resist pattern may be formed and the developability may be deteriorated. Furthermore, when the amount of the anthracene derivative of the formula (1) contained is less than 0.05 part by weight, it is impossible for the anthracene derivative to sufficiently absorb the radiation reflected at the surface of the substrate and there is a fear that it may become difficult for the anthracene derivative to exhibit sufficiently the halation-preventing effect which is the main effect of this invention. On the other hand, when the amount of the anthracene derivative contained exceeds 20 parts by weight, the ability of the resist composition (C) to absorb the radiation becomes too large, so that the amount of the radiation reaching the vicinity of the substrate becomes small. As a result, the resolution or the like tends to be deteriorated.

Here, preferable proportions of the main components in each of the resist composition (A), the resist composition (B) and the resist composition (C) are illustrated below.

The resist composition (A) is preferably composed of 100 parts by weight of the acid-decomposable group-containing resin, 0.05 to 20 parts by weight of the acid-generator and 0.05 to 20 parts by weight of the anthracene derivative of the formula (1).

The resist composition (A) is more preferably composed of 100 parts by weight of the acid-decomposable group-containing resin, 0.1 to 15 parts by weight of the acid-generator and 0.1 to 10 parts by weight of the anthracene derivative of the formula (1).

The resist composition (A) is most preferably composed of 100 parts by weight of the acid-decomposable group-containing resin, 0.5 to 10 parts by weight of the acid-generator and 0.2 to 5 parts by weight of the anthracene derivative of the formula (1).

The resist composition (B) is preferably composed of 100 parts by weight of the alkali-soluble resin, 0.05 to 20 parts by weight of the acid-generator, 5 to 150 parts by weight of the dissolution-controlling agent and 0.05 to 20 parts by weight of the anthracene derivative of the formula (1); more preferably composed of 100 parts by weight of the alkali-soluble resin, 0.1 to 15 parts by weight of the acid-generator, 5 to 100 parts by weight of the dissolution-controlling agent and 0.1 to 10 parts by weight of the anthracene derivative of the formula (1); and most preferably composed of 100 parts by weight of the alkali-soluble resin, 0.5 to 10 parts by weight of the acid-generator, 5 to 50 parts by weight of the dissolution-controlling agent and 0.2 to 5 parts by weight of the anthracene derivative of the formula (1).

The resist composition (C) is preferably composed of 100 parts by weight of the alkali-soluble resin, 0.05 to 20 parts by weight of the acid-generator, 3 to 85 parts of the cross-linking agent and 0.05 to 20 parts by weight of the anthracene derivative of the formula (1); more preferably composed of 100 parts by weight of the alkali-soluble resin, 0.1 to 15 parts by weight of the acid-generator, 5 to 75 parts by weight of the cross-linking agent and 0.1 to 10 parts by weight of the anthracene derivative of the formula (1); and most preferably composed of 100 parts by weight of the alkali-soluble resin, 0.5 to 10 parts by weight of the acid-generator, 10 to 65 parts by weight of the cross-linking agent and 0.2 to 5 parts by weight of the anthracene derivative of the formula (1).

Preparation of Solution

The chemically amplified, radiation-sensitive resin composition of this invention is, when used, dissolved in a solvent so that the solid concentration becomes, for example, 5 to 50% by weight, preferably 15 to 40% by weight and then filtered through a filter having a pore diameter of about 0.2 μm to prepare a resist solution.

The solvent used in the preparation of the resist solution includes, for example, ethylene glycol monoalkyl ethers such as ethylene glycol monomethyl ether, ethylene glycol monoethyl ether, ethylene glycol monopropyl ether, ethylene glycol monobutyl ether and the like; ethylene glycol monoalkyl ether acetates such as ethylene glycol monomethyl ether acetate, ethylene glycol monoethyl ether acetate, ethylene glycol monopropyl ether acetate, ethylene glycol monobutyl ether acetate and the like; diethylene glycol dialkyl ethers such as diethylene glycol dimethyl ether, diethylene glycol diethyl ether, diethylene glycol dipropyl ether, diethylene glycol dibutyl ether and the like; propylene glycol monoalkyl ethers such as propylene glycol monomethyl ether, propylene glycol monoethyl ether, propylene glycol monopropyl ether, propylene glycol monobutyl ether and the like; propylene glycol dialkyl ethers such as propylene glycol dimethyl ether, propylene glycol diethyl ether, propylene glycol dipropyl ether, propylene glycol dibutyl ether and the like; propylene glycol monoalkyl ether acetates such as propylene glycol monomethyl ether acetate, propylene glycol monoethyl ether acetate, propylene glycol monopropyl ether acetate, propylene glycol monobutyl ether acetate and the like; lactic acid esters such as methyl lactate, ethyl lactate, n-propyl lactate, isopropyl lactate, n-butyl lactate, isobutyl lactate and the like; aliphatic carboxylic acid esters such as methyl formate, ethyl formate, n-propyl formate, isopropyl formate, n-butyl formate, isobutyl formate, n-amyl formate, isoamyl formate, methyl acetate, ethyl acetate, n-propyl acetate, isopropyl acetate, n-butyl acetate, isobutyl acetate, n-amyl acetate, isoamyl acetate, n-hexyl acetate, methyl propionate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate, isobutyl butyrate and the like; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, methyl 3-methoxy-2-methylpropionate (methyl β-methoxybutyrate), 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl pyruvate, ethyl pyruvate and the like; aromatic hydrocarbons such as toluene, xylene and the like; ketones such as methyl ethyl ketone, 2-heptanone, 3-heptanone, 4-heptanone, cyclohexanone and the like; amides such as N-methylformamide, N,N-dimethylformamide, N-methylacetamide, N,N-dimethylacetamide, N-methylpyrrolidone and the like; lactones such as γ-butyrolactone and the like; etc.

These solvents can be used alone or in admixture of two or more.

The amount of the solvent used in the resist solution in this invention is preferably 20 to 3,000 parts by weight, more preferably 50 to 3,000 parts by weight and most preferably 100 to 2,000 parts by weight, per 100 parts by weight of the total solid content of the acid-decomposable group-containing resin, the alkali-soluble resin, the acid-generator, the dissolution-controlling agent, the cross-linking agent, the additives and the like.

Formation of Resist Pattern

In the formation of a resist pattern from the chemically amplified, radiation-sensitive resin composition of this invention, a resist solution as prepared in the above-mentioned manner is applied onto a substrate, for example, a silicon wafer, an aluminum-coated wafer or the like by a suitable coating method such as a spin-coating method, a flow-coating method, a roll-coating method or the like and then, if necessary, heat-treated (referred to hereinafter as pre-baked), thereby forming a resist film, and thereafter, the resist film is exposed to a radiation so as to form the desired pattern. As the radiation used in the exposure, an ultraviolet ray such as i line or the like; a far ultraviolet ray such as excimer laser or the like; an X ray such as synchrotron radiation or the like; a charged particle beam such as electron beam or the like; or the like is suitably selected depending upon the kind of the acid-generator. Also, exposure conditions such as the amount of radiation applied and the like are appropriately varied depending upon the formulation of the chemically amplified, radiation-sensitive resin composition, the kind of each additive and the like.

In the formation of a resist pattern using the chemically amplified, radiation-sensitive resin composition of this invention, a protective film can be formed on the resist film in order to prevent the influence of basic impurities and the like contained in the ambient atmosphere.

In this invention, in order to enhance the apparent sensitivity of the resist film, it is preferable to conduct heat-treatment after the exposure (referred to hereinafter as the after-exposure baking). The heating conditions for the after-exposure baking are varied depending upon the formulation of the chemically amplified, radiation-sensitive resin composition, the kind of each additive and the like; however, the heating temperature is preferably 30° to 200° C., more preferably 50° to 150° C.

Thereafter, the baked film is developed with an alkali developer to form the desired resist pattern.

As the above-mentioned alkali-developer, there is used an aqueous alkaline solution prepared by dissolving in water an alkali compound, for example, sodium hydroxide, potassium hydroxide, sodium carbonate, sodium silicate, sodium metasilicate, ammonium water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo[5,4,0]-7-undecene, 1,5-diazabicyclo[4,3,0]-5-nonene or the like so that the concentration becomes preferably 1 to 10% by weight, more preferably 2 to 5% by weight.

To the developer consisting of the above-mentioned aqueous alkaline solution can be added a water-soluble organic solvent such as methanol, ethanol or the like and a surfactant in appropriate amounts.

Incidentally, when a developer consisting of the above aqueous alkaline solution is used, usually, the developed film is washed with water after the development.

A method for forming a resist pattern using the chemically amplified, radiation-sensitive resin composition of this invention is described above in detail; however, in this invention, various modifications thereof can be made based on the above-mentioned technical idea and within its technical range.

DESCRIPTION OF THE PREFERRED EMBODIMENTS

Examples and Comparative Examples are shown below to explain this invention in more detail. However, these Examples are merely by way of illustration and not by way of limitation.

The measurement of Mw and evaluation of resist were conducted by the following procedures.

Mw

Using a GPC column manufactured by TOSOH CORPORATION (consisting of two G2000H$_{XL}$ columns, one G3000H$_{XL}$ column and one G4000H$_{XL}$ column), Mw was measured by a gel permeation chromatography using a monodispers styrene as a standard under such analytical conditions that the flow rate was 1.0 ml/min, the eluent was tetrahydrofuran, the column temperature was 40° C.

Sensitivity

The exposure necessary for forming a 0.4-µm line and space pattern (1L/1S) at a 1:1 line width was used as the optimum exposure and the sensitivity (unit: mJ/cm$^2$) was evaluated at the optimum exposure.

Resolution

The minimum dimension (unit: µm) of a resist pattern obtained at the optimum exposure was indicated as the resolution.

Developability

The case where undeveloped portions, scum and the like were not found after the alkali-development was determined as "good" developability and the case where at least one of these requirements was not satisfied was determined as "bad" developability.

Halation-preventing Effect

The case where when an aluminum substrate having a step structure as shown in FIG. 1 was used and the resist pattern obtained was observed from the upper position through a scanning type electron microscope, thinning (notching), thickening and the like of pattern were not found was determined as "good" in halation-preventing effect, and the case where thinning (notching), thickening and the like of pattern were found was determined as "bad" in halation-preventing effect.

Pattern shape

The upper side dimension La and the lower side dimension Lb of a 1L/1S-square cross-section of 0.4 µm in line width formed on a silicon wafer were measured using a scanning type electron microscope, and the case where $$0.85 \leq La/Lb \leq 1.0$$

was satisfied, the side wall roughness of pattern was a little, the notching of pattern in the vicinity of the substrate, the overhang at the top of pattern and the thinning of the pattern head were not observed was determined as "good" in pattern shape and the case where at least one of these requirements was not satisfied was determined as "bad" in pattern shape.

Production of Acid-decomposable Group-containing Resin

Synthesis Example 1

In 131 g of propylene glycol monomethyl ether were dissolved 67 g (0.5 mole) of p-isopropenylphenol and 64 g (0.5 mole) of t-butyl acrylate, and 8 g of azobisisobutyronitrile was added thereto, after which they were kept at a reaction temperature of 60° C. under a nitrogen atmosphere and subjected to polymerization for 10 hours. After the polymerization, the reaction mixture was dropped into a 5 liter of hexane to coagulate a resin, and the resin was recovered, then separated and washed with five 1-liter portions of hexane. Thereafter, the copolymer was re-dissolved in acetone and then the resulting solution was dropped into a large amount of water to coagulate the copolymer, thereby obtaining a white resin (yield: 56%).

This resin had a Mw of 12,400, and as a result of analysis by $^{13}$C-NMR, the copolymerization ratio (mole ratio) of p-isopropenylphenol and t-butyl acrylate was 50:50. This resin is referred to hereinafter as Resin (A).

Synthesis Example 2

To a solution of 12 g of poly(p-vinylphenol) and 5 g of triethylamine in 50 g of dioxane was added 11 g of di-t-butyl carbonate with stirring, and they were stirred at room temperature for a further six hours, after which oxalic acid was added thereto to neutralize triethylamine. Subsequently, the reaction mixture was dropped into a large amount of water to coagulate a resin and the resin was recovered and washed several times with pure water to obtain a white resin (yield: 85%).

The resin obtained had a Mw of 9,200, and as a result of analysis by $^{13}$C-NMR, the resin had such a structure that 85% of the hydrogen atoms of the phenolic hydroxyl groups in the poly(p-vinylphenol) had been replaced by t-butoxycarbonyl groups. This resin is referred to hereinafter as Resin (B).

Synthesis Example 3

In 80 g of propylene glycol monomethyl ether were dissolved 78 g (0.5 mole) of tetrahydropyranyl acrylate and 42 g (0.5 mole) of methyl methacrylate, and 3 g of azobisisobutyronitrile was added thereto, after which they were subjected to polymerization for 10 hours under a nitrogen atmosphere while the reaction temperature was kept at 80° C. After the polymerization, the reaction mixture was dropped into a large amount of water to coagulate a resin. The resin was recovered and dried in a vacuum drier kept at 50° C. overnight to obtain 96 g of a white fine powder of tetrahydropyranyl acrylate/methyl methacrylate copolymer resin.

The resin obtained had a Mw of 25,400 and as a result of $^{13}$C-NMR measurement, the copolymerization ratio (mole ratio) of tetrahydropyranyl acrylate to methyl methacrylate was 50:50. This resin is referred to hereinafter as Resin (C).

Synthesis Example 4

120 g of a vinylphenol mixture consisting of 20% by weight of p-vinylphenol, 65% by weight of p-ethylphenol and 15% by weight of other components (10% by weight of water, 4% by weight of p-cresol and 1% by weight of phenol) was mixed with 17 g of t-butyl acrylate and 50 g of propylene glycol monomethyl ether to prepare a uniform solution. Subsequently, the solution was bubbled by a nitrogen gas for 30 minutes, and then, 1.9 g (2 mole % of the total monomer amount) of 2,2'-azobis(4-methoxy-2,4-dimethylvaleronitrile was added as a radical initiator to the solution, after which the resulting mixture was subjected to polymerization for 7 hours while the reaction temperature was kept at 40° C. with continuing bubbling. After the polymerization, the reaction mixture was dropped into a large amount of hexane to coagulate a resin, and the resin was recovered and dissolved in acetone, after which the above procedure for coagulating the resin in hexane was repeated to completely remove the unreacted monomers. The resin was dried at 50° C. under reduced pressure to obtain a white resin (yield: 55%).

This resin had a Mw of 31,000 and as a result of analysis by $^{13}$C-NMR, the copolymerization ratio (mole ratio) of p-vinylphenol and t-butyl acrylate was 60:40. This resin is referred to hereinafter as Resin (D).

Synthesis Example 5

In 100 ml of dioxane was dissolved 24 g of poly(p-hydroxystyrene) (Mw: 12,000), and then the resulting solution was bubbled by nitrogen for 30 minutes. To this solution were added 8 g of ethyl vinyl ether and 1 g of pyridium p-toluenesulfonate as a catalyst and they were subjected to reaction for 12 hours. The reaction mixture obtained was dropped into 1% by weight aqueous ammonia solution to precipitate a resin. This resin was dried in a vacuum drier kept at 50° C. overnight.

The resin obtained had a Mw of 12,000 and a Mw/Mn ratio of 1.6, and as a result of a $^{13}$C-NMR measurement, the resin had such a structure that 45% of the hydrogen atoms of the phenolic hydroxyl groups had been replaced by 1-ethoxyethyl groups. This resin is referred to hereinafter as Resin (E).

Production of Alkali-soluble Resin

Synthesis Example 6

In 80 g of propylene glycol monomethyl ether was dissolved 88 g of p-t-butoxystyrene, and then, 2 g of azobisisobutyronitrile was added to the solution, after which they were subjected to polymerization for 10 hours under a nitrogen atmosphere while the reaction temperature was kept at 80° C. After the polymerization, an aqueous sulfuric acid solution was added to the reaction mixture and the resulting mixture was subjected to hydrolysis at 80° C. for 8 hours. Subsequently, ethyl acetate was added to the reaction mixture and the resulting mixture was washed with water, after which the solvent was replaced by acetone. The resulting resin solution was dropped into a large amount of water to coagulate a resin. The resin was recovered and dried in a vacuum drier kept at 50° C. overnight to obtain 48 g of a white fine powder of poly(p-hydroxystyrene).

The resin obtained had a Mw of 10,000. This resin is referred to hereinafter as Resin (F).

Synthesis of Dissolution-controlling Agent

Synthesis Example 7

In tetrahydrofuran was dissolved 15 g of bisphenol A, and thereafter, di-t-butyl dicarbonate and triethylamine were added, respectively, in amounts two times and 0.3 time the total number of moles of the phenolic hydroxyl groups in the bisphenol A, after which they were subjected to reaction under reflux for 6 hours. Subsequently, the reaction mixture was dropped into water and the precipitate formed was recovered and dried in a vacuum drier kept at 50° C. overnight, to obtain a product of the above-mentioned formula (4) which is referred to hereinafter as Dissolution-Controlling Agent (a).

Synthesis Example 8

The same procedure as in Synthesis Example 6 was repeated, except that 18.6 g of a compound of the formula (5) in which all the t-butoxycarbonyl groups had been replaced by hydrogen atoms was substituted for the bisphenol A, to obtain a product of the formula (5), which is referred to hereinafter as Dissolution-Controlling Agent (b).

EXAMPLES 1 TO 19 AND COMPARATIVE EXAMPLES 1 TO 4

The components shown in Table 1 (parts are by weight) were mixed and then subjected to micro filtration through a filter having a pore diameter of 0.2 μm to remove foreign matter, thereby preparing a resist solution.

This resist solution was spin-coated on a silicon wafer, pre-baked under the conditions shown in Table 2 to form a resist film having a thickness of 1 μm. This film was exposed to a radiation as shown in Table 2 through a pattern mask and then subjected to the after-baking exposure under the conditions shown in Table 2. Subsequently, the baked film was subjected to alkali-development using 2.38% by weight aqueous tetramethylammonium hydroxide solution at 23° C. for 60 seconds and then washed with water to form a resist pattern. The resists obtained were evaluated to obtain the results shown in Table 3.

Cross-linking Agent (c): Hexa(methoxymethyl)melamine
(d): Tetra(methoxymethyl)urea
(e): Tetra(methoxymethyl)glycoluril

TABLE 1

| | Resin | | Acid-generator | | Anthracene derivative | | Dissolution-controlling agent or cross-linking agent | | Acid-diffusion-controlling agent | | Solvent | |
|---|---|---|---|---|---|---|---|---|---|---|---|---|
| | Kind | (part) | Kind | (part) | Kind | (part) | Kind | (part) | Kind | (part) | Kind | (part) |
| Example 1 | A | (100) | α | (5) | i | (0.4) | — | | I | (2.0) | PGMEA | (350) |
| Example 2 | A | (100) | β | (5) | i | (0.5) | — | | — | | BL/EEP | (250/100) |
| Example 3 | A/F | (80/20) | α/γ | (3/2) | i | (0.2) | — | | — | | PGMEA | (350) |
| Example 4 | A | (100) | α/γ | (3/2) | i | (0.4) | — | | I | (1.8) | MMP | (350) |
| Example 5 | B | (100) | ε | (5) | i | (0.8) | — | | II | (2.0) | PGMEA | (350) |
| Example 6 | B | (100) | β | (5) | ii | (0.6) | — | | — | | PGMEA | (350) |
| Example 7 | B | (100) | α/γ | (3/2) | iii | (0.5) | — | | — | | PGMEA | (350) |
| Example 8 | C | (100) | β | (5) | i | (0.8) | — | | III | (1.5) | MMP | (350) |
| Example 9 | C | (100) | α/γ | (3/1) | i | (0.7) | — | | III | (1.8) | PGMEA | (350) |
| Example 10 | D | (100) | γ | (3) | i | (0.8) | — | | — | | EL/BA | (250/100) |
| Example 11 | F | (100) | α | (5) | ii | (0.7) | a | (30) | II | (1.2) | PGMEA | (400) |
| Example 12 | F | (100) | ε | (5) | iii | (0.5) | b | (30) | — | | PGMEA | (400) |
| Example 13 | F | (100) | α/γ | (3/1) | i | (0.6) | a | (30) | I | (1.2) | PGMEA | (400) |
| Example 14 | F | (100) | δ | (2) | i | (0.8) | c | (20) | — | | MMP | (400) |
| Example 15 | F | (100) | β | (5) | i | (0.7) | d | (25) | — | | PGMEA | (400) |
| Example 16 | F | (100) | α | (3) | iii | (0.6) | e | (25) | — | | EL | (400) |
| Example 17 | E | (100) | ε | (3) | i | (0.5) | — | | II | (1.2) | PGMEA | (350) |
| Example 18 | A/E | (50/50) | γ | (3) | i | (0.5) | — | | III | (1.2) | PGMEA | (350) |
| Example 19 | B/E | (50/50) | γ/ε | (3/1) | i | (0.6) | — | | II | (1.2) | PGMEA | (350) |
| Comp. Ex. 1 | A | (100) | α | (5) | — | | — | | — | | PGMEA | (350) |
| Comp. Ex. 2 | B | (100) | β | (5) | — | | — | | — | | PGMEA | (350) |
| Comp. Ex. 3 | C | (100) | γ | (3) | — | | — | | — | | EL | (400) |
| Comp. Ex. 4 | D | (100) | δ | (2) | — | | — | | — | | MMP | (380) |

In Table 1, other components than Resins (A) to (F) and Dissolution-Controlling Agents (a) and (b) were as follows:

Anthracene Derivative (i): Anthracene-9-methanol
(ii): Anthracene-9-carboxyethyl
(iii): Anthracene-9-carboxy-n-butyl Acid-generator (α): N-(Trifluoromethylsulfonyloxy)-bicyclo[2.2.1]-hept-5-ene-2,3-dicarboxyimide
(β): N-(Camphanylsulfonyloxy)naphthylimide
(γ): Triphenylsulfonium triflate
(δ): 2-(4-Methoxy-1-naphthyl)-4,6-bis(trichloromethyl)-1,3,5-triazine
(ε): Bis(cyclohexylsulfonyl)diazomethane Acid-diffusion-controlling Agent (I): Tripropylamine
(II): Tri-n-butylamine
(III): Diaminodiphenylmethane Solvent BA: n-Butyl acetate
EEP: Ethyl 3-ethoxypropionate
EL: Ethyl lactate
MMP: Methyl 3-methoxypropionate
PGMEA: Propylene glycol monomethyl ether acetate

TABLE 2

| | Prebake | | Radiation used for irradiation | After-exposure-baking | |
|---|---|---|---|---|---|
| | Temp. (°C.) | Time (sec) | Kind (wavelength) | Temp. (°C.) | Time (sec) |
| Example 1 | 150 | 120 | KrF excimer laser (248 nm) | 155 | 120 |
| Example 2 | 90 | 120 | KrF excimer laser (248 nm) | 90 | 120 |
| Example 3 | 150 | 120 | KrF excimer laser (248 nm) | 150 | 120 |
| Example 4 | 150 | 90 | KrF excimer laser (248 nm) | 150 | 90 |

TABLE 2-continued

|  | Prebake | | Radiation used for irradiation | After-exposure-baking | |
|---|---|---|---|---|---|
|  | Temp. (°C.) | Time (sec) | Kind (wavelength) | Temp. (°C.) | Time (sec) |
| Example 5 | 90 | 120 | KrF excimer laser (248 nm) | 90 | 120 |
| Example 6 | 110 | 120 | KrF excimer laser (248 nm) | 110 | 120 |
| Example 7 | 90 | 120 | KrF excimer laser (248 nm) | 90 | 120 |
| Example 8 | 90 | 120 | ArF excimer laser (193 nm) | 90 | 120 |
| Example 9 | 120 | 150 | ArF excimer laser (193 nm) | 120 | 150 |
| Example 10 | 100 | 120 | KrF excimer laser (248 nm) | 100 | 120 |
| Example 11 | 90 | 120 |  | 90 | 120 |
| Example 12 | 110 | 90 | KrF excimer laser (248 nm) | 110 | 90 |
| Example 13 | 90 | 110 | KrF excimer laser (248 nm) | 90 | 110 |
| Example 14 | 100 | 90 | KrF excimer laser (248 nm) | 100 | 90 |
| Example 15 | 90 | 120 | KrF excimer laser (248 nm) | 90 | 120 |
| Example 16 | 110 | 60 | KrF excimer laser (248 nm) | 110 | 60 |
| Example 17 | 90 | 90 | KrF excimer laser (248 nm) | 110 | 90 |
| Example 18 | 120 | 90 | KrF excimer laser (248 nm) | 140 | 90 |
| Example 19 | 90 | 90 | KrF excimer laser (248 nm) | 110 | 90 |
| Comp. Ex. 1 | 150 | 120 | KrF excimer laser (248 nm) | 150 | 120 |
| Comp. Ex. 2 | 90 | 120 | KrF excimer laser (248 nm) | 110 | 120 |
| Comp. Ex. 3 | 90 | 120 | KrF excimer laser (248 nm) | 90 | 120 |
| Comp. Ex. 4 | 90 | 120 | KrF excimer laser (248 nm) | 110 | 120 |

TABLE 3

|  | Sensitivity (mJ/cm$^2$) | | Resolution (μm) | Halation-preventing effect | Pattern shape |
|---|---|---|---|---|---|
|  | Just after preparation | After 30 days |  |  |  |
| Example 1 | 40 | 40 | 0.24 | Good | Good |
| Example 2 | 42 | 42 | 0.26 | Good | Good |
| Example 3 | 30 | 30 | 0.24 | Good | Good |
| Example 4 | 20 | 20 | 0.24 | Good | Good |
| Example 5 | 42 | 42 | 0.24 | Good | Good |
| Example 6 | 40 | 40 | 0.26 | Good | Good |
| Example 7 | 22 | 22 | 0.26 | Good | Good |
| Example 8 | 36 | 36 | 0.24 | Good | Good |
| Example 9 | 38 | 38 | 0.24 | Good | Good |
| Example 10 | 42 | 42 | 0.26 | Good | Good |
| Example 11 | 38 | 38 | 0.24 | Good | Good |
| Example 12 | 40 | 40 | 0.26 | Good | Good |
| Example 13 | 36 | 36 | 0.26 | Good | Good |
| Example 14 | 42 | 42 | 0.24 | Good | Good |
| Example 15 | 34 | 32 | 0.26 | Good | Good |
| Example 16 | 38 | 38 | 0.26 | Good | Good |
| Example 17 | 20 | 20 | 0.24 | Good | Good |
| Example 18 | 25 | 25 | 0.24 | Good | Good |
| Example 19 | 22 | 22 | 0.24 | Good | Good |
| Comp. Ex. 1 | 36 | 36 | 0.28 | Bad | Bad (*) |
| Comp. Ex. 2 | 42 | 42 | 0.30 | Bad | Bad (*) |
| Comp. Ex. 3 | 40 | 40 | 0.30 | Bad | Bad (*) |
| Comp. Ex. 4 | 34 | 34 | 0.28 | Bad | Bad (*) |

Note: (*) Rattling of side wall was remarkable.

What is claimed is:

1. A positive type chemically amplified, radiation-sensitive resin composition to form a resist film exposable to a radiation having a wave length of about 193 nm to 248 nm which comprises in admixture:
  (a) an acid-decomposable group-containing resin which is an alkaline-insoluble or -sparingly soluble resin protected with an acid-decomposable group but becomes an alkali-soluble resin when the acid-decomposable group is decomposed in the presence of an acid,
  (b) an acid-generator, and
  (c) an anthracene derivative which is at least one compound selected from the group consisting of anthracene-9-methanol, anthracene-9-carboxyethyl and anthracene-9-carboxy-n-butyl, wherein the acid-decomposable group is at least one selected from the groups consisting of t-butyl group, t-butoxycarbonylmethyl group, t-butoxycarbonyl group, 1-methoxyethyl group and 1-ethoxyethyl group, wherein the alkali-soluble resin includes a vinylic resin having a repeating unit resulting from cleavage of the polymerizable double bond of at least one polymerizable monomer having an acidic functional group and, which further comprises an acid-diffusion-controlling agent, wherein the acid-diffusion-controlling agent is at least one compound selected from the group consisting of ammonia, trimethylamine, triethylamine, tripropylamine, tributylamine, tripentylamine, trihexylamine, triheptylamine, trioctylamine, aniline, N-methylaniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrrolidone, piperidine, imidazole, 4-methylimidazole, 4-methyl-2-phenylimidazole, benzimidazole, thiabendazole, pyridine, 2-methylpyridine, 4-ethylpyridine, 2-phenylpyridine, 4-phenylpyridine, 1-methyl-4-phenylpyridine, 2-(1-ethylpropyl)pyridine, 2-benzylpyridine, nicotinamide, dibenzoylthiamine, tetrabutyric acid libofuravine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene and 1,3-bis[1-(4-aminophenyl)-1-methylethyl]benzene.

2. The resin composition according to claim 1, wherein the polystyrene-reduced weight average molecular weight (Mw) of the acid-decomposable group-containing resin is 1,000 to 150,000 as measured by a gel permeation chromatography.

3. The resin composition according to claim 1, wherein per 100 parts by weight of the acid-decomposable group-containing resin (a), the amount of the acid generator (b) is 0.05 to 20 parts by weight and the amount of the anthracene derivative (c) is 0.05 to 20 parts by weight.

4. The composition according to claim 1, which further comprises an additive selected from the group consisting of a surfactant and a sensitizing agent.

5. The resin composition according to claim 1, wherein a ratio of the number of the acid-decomposable groups to the total number of the acidic functional groups and the acid-decomposable groups in the acid-decomposable group-containing resin is 15 to 60%.

6. The resin composition according to claim 1, wherein the polymerizable monomer having an acid functional group is a compound selected from the group consisting of hydroxystyrene, hydroxy-α-methylstyrene, vinylbenzoic acid, carboxymethylstyrene, carboxymethoxystyrene, (meth)aerylic acid, crotonic acid, maleic acid, fumaric acid, itaconic acid, citraconic acid, mesaconic acid and cinnamic acid.

7. The resin composition according to claim 1, wherein the polymerizable monomer having an acidic functional group is a compound selected from the group consisting of p-isopropenylphenol (hydroxy-α-methylstyrene), acrylic acid, p-vinylphenol (hydroxystyrene) and methacrylic acid.

8. The composition according to claim 7, which further comprises an additive selected from the group consisting of a surfactant and a sensitizing agent.

9. The composition according to claim 1, wherein the acid diffusion-controlling agent is at least one selected from the group consisting of tributylamine, tripentylamine, trihexylamine, triheptylamine, trioctylamine, benzimidazole, 4-phenylpyridine, 4,4'-diaminodiphenyl ether and nicotinamide.

10. The composition according to claim 7, which further comprises an acid-diffusion-controlling agent, wherein the acid-diffusion-controlling agent is at least one compound selected from the group consisting of ammonia, trimethylamine, triethylamine, tripropylamine, tributylamine, tripentylamine, trihexylamine, triheptylamine, trioctylamine, aniline, N-methylaniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrrolidone, piperidine, imidazole, 4-methylimidazole, 4-methyl-2-phenylimidazole, benzimidazole, thiabendazole, pyridine, 2-methylpyridine, 4-ethylpyridine, 2-phenylpyridine, 4-phenylpyridine, 1-methyl-4-phenylpyridine, 2-(1-ethylpropyl)pyridine, 2-benzylpyridine, nicotinamide, dibenzoylthiamine, tetrabutyric acid libofuravine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl) propane, 1,4-bis[1-(4-aminophenyl)-1-methylethyl]benzene and 1,3-bis[1-(4-aminophenyl)-1-methylethyl]benzene.

11. A positive type chemically amplified, radiation-sensitive resin composition which comprises:

(d) an alkali-soluble resin, (b) an acid-generator, (e) a dissolution-controlling agent consisting of a compound which has the properties of controlling the alkali-solubility of the alkali-soluble resin, said properties being reduced or lost when the compound is decomposed in the presence of an acid, or which has the action of increasing the alkali-solubility of the alkali-soluble resin, and (c) an anthracene derivative which is at least one compound selected from the group consisting of anthracene-9methanol, anthracene-9-carbonylethyl and anthracene-9-carbonyl-n-butyl.

12. The resin composition according to claim 11, wherein the alkali-soluble resin is a resin having at least one acidic functional group selected from the group consisting of phenolic hydroxyl group and carboxyl group and being soluble in an alkali developer.

13. The resin composition according to claim 11, wherein the alkali-soluble resin is a vinylic resin having a repeating unit resulting from cleavage of the polymerizable double bond of at least one polymerizable monomer having an acidic functional group or a condensation type resin having a condensation type repeating unit and having an acidic functional group.

14. The resin composition according to claim 13, wherein the vinylic resin is a polymer of at least one monomer selected from the group consisting of hydroxystyrene, hydroxy-α-methylstyrene, vinylbenzoic acid, carboxymethylstyrene, carboxymethoxystyrene, (meth)acrylic acid, crotonic acid, maleic acid, fumaric acid, itaconic acid, citraconic acid, mesaconic acid and cinnamic acid.

15. The resin composition according to claim 13, wherein the condensation type resin is a novolak resin.

16. The resin composition according to claim 11, wherein the alkali-soluble resin has a polystyrene-reduced weight average molecular weight (Mw) of 1,000 to 150,000 as measured by a gel permeation chromatography.

17. The resin composition according to claim 11, wherein per 100 parts by weight of the alkali-soluble resin (d), the amount of the acid-generator (b) is 0.5 to 20 parts by weight, the amount of the dissolution-controlling agent (e) is 5 to 150 parts by weight and the amount of the anthracene derivative (c) is 0.05 to 20 parts by weight.

* * * * *